United States Patent [19]
Choi

[11] Patent Number: 5,991,203
[45] Date of Patent: Nov. 23, 1999

[54] CIRCUIT AND METHOD OF ERASING A NONVOLATILE SEMICONDUCTOR MEMORY

[75] Inventor: Jeong-Hyuk Choi, Suwon-shi, Rep. of Korea

[73] Assignee: Samsung Electronics Co., Ltd., Rep. of Korea

[21] Appl. No.: 09/179,694

[22] Filed: Oct. 27, 1998

[30] Foreign Application Priority Data

Dec. 6, 1997 [KR] Rep. of Korea ..................... 97-66554

[51] Int. Cl.⁶ ................................................. G11C 16/04
[52] U.S. Cl. .................................. 365/185.27; 365/185.24
[58] Field of Search ........................ 365/185.01, 185.27, 365/185.24, 185.3, 185.29, 185.26

[56] References Cited

U.S. PATENT DOCUMENTS

| | | | |
|---|---|---|---|
| 4,432,075 | 2/1984 | Eitan ........................................ | 365/185 |
| 5,295,107 | 3/1994 | Okazawa et al. ........................ | 365/218 |
| 5,511,022 | 4/1996 | Yim et al. ............................ | 365/185.17 |
| 5,521,867 | 5/1996 | Chen et al. ........................ | 365/185.33 |
| 5,557,565 | 9/1996 | Kaya et al. ........................ | 365/185.01 |

OTHER PUBLICATIONS

IEEE Tech. Dig. IEDM, pp. 307–310, 1991, "A Self–Convergence Erasing Scheme For A Simple Stacked Gate Flash Eeprom". Sep., 1991.

*Primary Examiner*—David Nelms
*Assistant Examiner*—Anh Phung
*Attorney, Agent, or Firm*—Lappin & Kusmer LLP

[57] ABSTRACT

A system capable of stabilizing a tight distribution of threshold voltages of erased flash EEPROM memory cells within a fast time period includes at least one memory cell having source, channel and drain regions on a semiconductor substrate, a floating gate over the channel region on a tunnel oxide layer and a control gate over the floating gate, and a circuit for converging the threshold voltage of an erased memory cell to within a predetermined voltage range. The circuit includes: a driving circuit for applying a first voltage to the control gate and a second voltage between the source and drain regions during the self-convergence operation; and a backbias generator for applying a backbias voltage to the substrate so as to generate hot electrons/holes in the channel region and to inject ones of the hot electrons/holes into the floating gate during the self-convergence operation.

7 Claims, 6 Drawing Sheets

CIRCUIT AND METHOD OF ERASING A NONVOLATILE SEMICONDUCTOR MEMORY

BACKGROUND OF THE INVENTION

Unlike dynamic random access memory (DRAM) and static random access memory (DRAM), a nonvolatile semiconductor memory is a type of semiconductor memory that can preserve stored data even if power has been removed. Nonvolatile semiconductor memories include read only memories (ROMs), programmable read only memories (PROMs), erasable programmable read only memories (EPROMs), and electrically erasable programmable read only memories (EEPROMs, or flash EEPROMs).

A flash EEPROM includes a plurality of memory cells arranged in a matrix of rows and columns on a semiconductor substrate. The flash EEPROM has the capability of simultaneously erasing the entire array of memory cells as well as a subset of cell blocks divided into one or more memory cell rows. The flash EEPROM further offers the capability of electrically programming or reading the contents of one or more memory cells in the array.

Memory cells in the flash EEPROM typically employ floating gate transistors arranged in rows and columns, each having a source, a drain, a floating gate and a control gate. The floating gate, typically comprising polycrystalline silicon, overlaps a channel region formed in a semiconductor substrate, and overlaps edge portions of source and drain regions at opposite sides of the channel region through a tunnel oxide layer. The control gate lies over the floating gate, separated therefrom by an intermediate insulating layer. Control gates of floating gate transistors occupying a same row are connected to a common one of multiple word lines. Drain regions of floating gate transistors occupying the same column are connected to a common one of multiple bit lines. Source regions of the floating gate transistors are connected to a common source line.

A floating gate transistor is programmed by grounding the source region, applying a positive voltage, such as 6 volts, to the drain region, and applying a high voltage, such as 12 volts, to the control gate. The electric field between the drain and source regions causes electrons to accelerate along the channel region, thereby generating hot electrons by impact ionization. The hot electrons gain energy from the high voltage applied to the control gate and are trapped in the floating gate, by jumping through the potential barrier of the tunnel oxide layer. Thus, electrons are charged into the floating gate by channel hot electron injection. As a result, the threshold voltage of the floating gate transistor is increased by the injection of electrons into the floating gate. This increased threshold voltage, for example about 7 volts, causes the floating gate transistor to be nonconductive during a normal read-out operation of the memory.

To erase a programmed floating gate transistor, the control gate is grounded, the drain region is floated, and an erase voltage, such as 12 volts, is applied to the source region. Electrons stored in the floating gate are tunnelled out to the source region by the Fowler-Nordheim tunnelling effect (hereinafter referred to as F-N tunnelling). As a result, the floating gate transistor has a decreased threshold voltage, such as about 2 volts, thereby causing the transistor to be conductive during a read-out operation.

To read data stored in a floating gate transistor, a read-out voltage, such as about 5 volts, is applied to the control gate, the source region is grounded, and a voltage of about 1 volts is applied to the drain region. An erased memory cell, i.e. an erased floating gate transistor, is conductive, and a programmed memory cell is nonconductive. Data stored in the memory cell may be read-out by a sense amplifier adapted to sense the conductive state of the memory cell.

During erasing, if an erase voltage is applied for too long of a period of time or at too high of a voltage level, some of the floating gate transistors may become overerased. A floating gate transistor is overerased when its threshold voltage becomes negative. Once a floating gate transistor has been overerased, it operates as a depletion mode device. Thus, even if the overerased transistor is not selected, it remains in a conductive state. Thus, memory cells sharing the same bit line as an overerased cell are subject to inaccurate reading and programming operations, thereby leading to malfunction of the memory device.

Flash EEPROM cells within a matrix generally do not erase at the same rate due to the deterioration of tunnel oxide layers by variations of process and erase time and programming/erasing cycles. Thus, a distribution of threshold voltages of memory cells may be dispersed. If some of the memory cells are in overerased states or if their threshold voltages are not in the range of reading margins of the erased cells, the flash EEPROM will malfunction.

Techniques have been developed to prevent overerasure of flash EEPROM cells and to converge the threshold voltage distribution of the floating gate transistors to within a predetermined voltage range. An example is disclosed in "Self-Convergence Erasing Scheme For A Simple Stacked Gate Flash EEPROM", IEEE Tech. Dig. IEDM 1991, pp 307~310, incorporated herein by reference. The self-convergence erasing technique has two steps. In the first step, the flash EEPROM cells are erased by F-N tunnelling from the floating gates to the source regions by applying −13 volts to the control gates, grounding the drains, and applying 5 volts to the source regions. During the second step, the threshold voltages of the cells are converged by employing avalanche hot carrier injection, in which 5 volts is applied to the source regions with the control gates and drains grounded. The avalanche hot carrier injection causes the threshold voltages of the memory cells to converge to a certain steady-state determined by a balance between the avalanche hot electron injection and the avalanche hot hole injection. However, this technique suffers from a problem in that a high amount of drain-source current flows during the self-convergence erasing step. It also takes a large amount of time to self-converge the threshold voltages. Furthermore, the avalanche hot holes produced in the self-convergence step incur the deterioration of tunnel oxide layers, thereby affecting the reliability and life span of the flash EEPROM.

In an attempt to address the above problems, an improved technique is disclosed in U.S. Pat. No. 5,521,867, incorporated herein by reference. In this technique, the self-convergence step for providing a tighter distribution of the threshold voltages following erasure employs avalanche hot carrier injection by applying 6 volts to drain regions connected to bit lines and a control gate voltage to the control gates connected to word lines. It offers the advantage of an adjustable steady-state threshold voltage by the application of the control gate voltage. However, since the avalanche hot carrier injection is similar to the programming step, increasing the control gate voltage to enhance the self-convergence speed momentarily programs the memory cells, and thereby may cause them to vary outside the reading margin range of the erased memory cells. The control gate voltage could be lowered to mitigate this problem, but reducing the control gate voltage causes a decrease in the speed of the self-convergence. Moreover, the process variation for the memory cells makes it difficult to adjust the self-convergence characteristics. Since this technique employs avalanche impact ionization, it is not able to prevent the flow of current through the channels of the memory cells and the generation of avalanche hot holes. Thus, there is a need for an improved technique capable of preventing the degradation of the tunnel oxide layers due to the hot holes and the consumption of the current flowing through the cells.

A second technique is disclosed in U.S. Pat. No. 5,295,107, incorporated herein by reference, in which the first and second steps employ F-N tunnelling. That is, in the first step, erasure is performed by applying an erase voltage of −14 volts to the control gate for 0.1 sec with the drain region grounded, and by applying a voltage of 5 volts to the source region. Following erasure, in the second step, the self-convergence of the threshold voltages for the memory cells is performed by applying a voltage of 14 volts to the control gate for 0.1 sec with the source and drain regions grounded. Since F-N tunnelling is used, which is slower than the hot carrier injection technique described above, a self-convergence time period of several hundreds of milliseconds is required. To enhance the self-convergence speed, the voltage between the control gate and the substrate may be increased. However, since this would drive the memory cells to a programmed state, such an increase must be avoided. For this reason, use of this technique results in a self-convergence speed which cannot be reduced below several tens of milliseconds.

SUMMARY OF THE INVENTION

The present invention relates to nonvolatile semiconductor memories, and more particularly to a circuit for and method of electrically erasing a flash type electrically erasable programmable read only memory (hereinafter referred to as a flash EEPROM).

It is an object of the present invention to provide a flash EEPROM capable of stabilizing a tight distribution of threshold voltages of erased memory cells within a relatively fast time period.

It is another object of the present invention to provide a flash EEPROM capable of Is minimizing the current consumption flowing through channels of memory cells during a self-convergence operation of the threshold voltages of erased memory cells.

It is still another object of the present invention to provide a flash EEPROM capable of minimizing the degradation of tunnel oxide layers of memory cells during the self-convergence operation of the threshold voltages of erased memory cells.

To achieve the above objects the present invention is directed to a flash EEPROM including at least one memory cell having source, channel and drain regions on a semiconductor substrate, a floating gate over the channel region and separated therefrom by a tunnel oxide layer, a control gate over the floating gate, a convergence circuit for performing a self-convergence operation after erasing the memory cell for converging a threshold voltage of the erased memory cell within a predetermined voltage range, the convergence circuit including: a driving circuit for applying a first voltage to the control gate and for applying a second voltage between the source and drain regions during the self-convergence operation; and a backbias generator for applying a backbias voltage to the substrate so as to generate hot electrons/holes in the channel region and to inject ones of the hot electrons/holes into the floating gate during the self-convergence operation.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
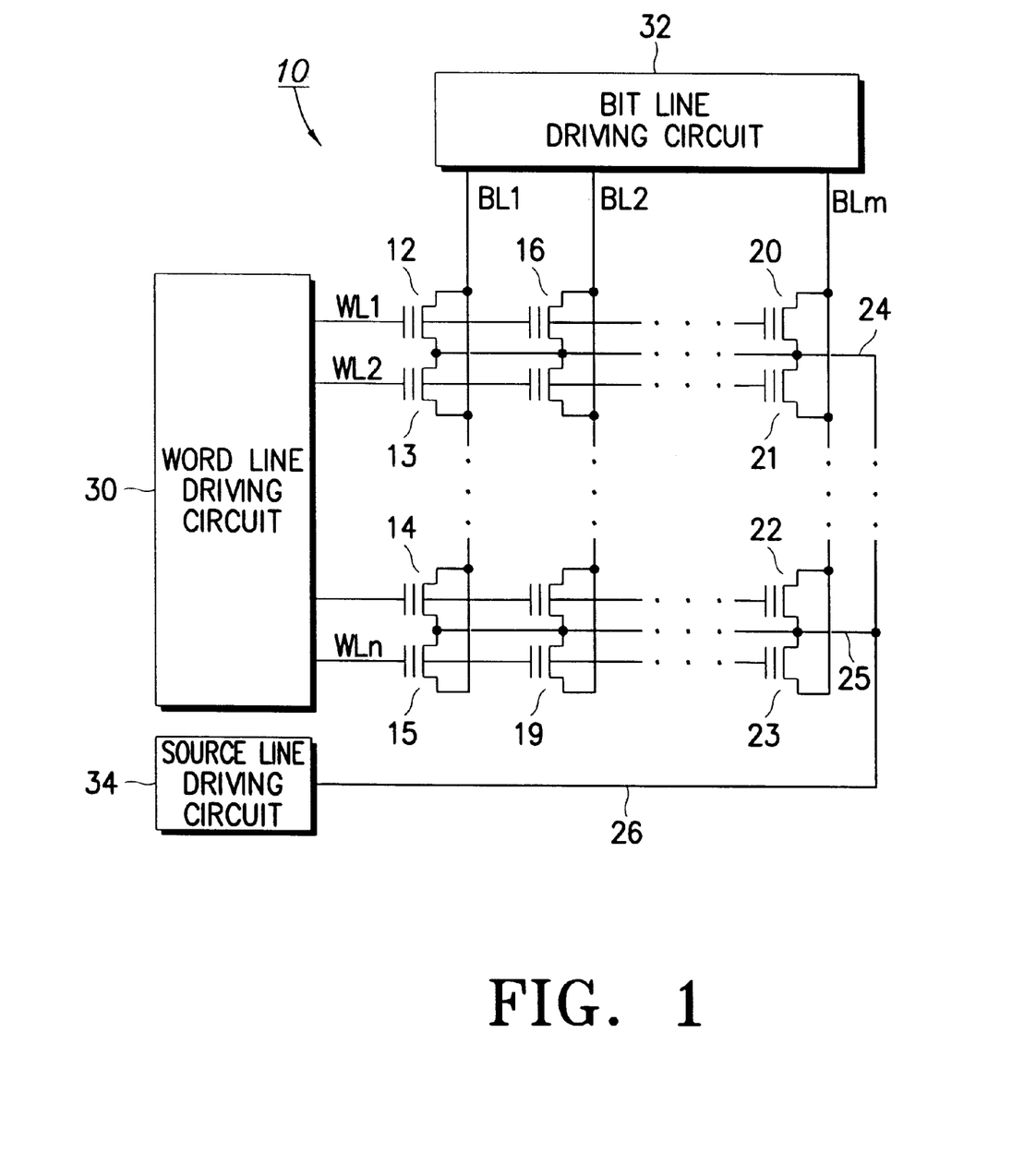
FIG. 1 is a schematic circuit diagram of flash EEPROM according to an embodiment of the present invention.

FIG. 1 is a schematic circuit diagram of a flash EEPROM according to an embodiment of the present invention. A memory cell array 10 includes a multiplicity of memory cells 12–23 arranged in a matrix of rows and columns. Each word line WL1~WLn is connected to the control gates of memory cells 12–23 in a corresponding row. Each bit line BL1~BLm is connected to drain regions of memory cells 12–23 in a corresponding column. Each source line 24, 25 is connected to a corresponding common source region of memory cell pairs 12, 13; . . . ; 22, 23, and all individual source lines are, in turn, connected to a common source line 26. The word lines WL1~WLn are connected to a word line driving circuit 30 which operates to provide a proper voltage to each word line in response to row address signals from a row decoder (not shown) and in response to a control signal associated with reading, programming and erasing operations from a control circuit (not shown). A bit line driving circuit 32 operates to provide a proper voltage to each bit line BLm in response to column address signals from a column decoder (not shown) and in response to a control signal associated with one of the various operations from the control circuit. A source line driving circuit 34 provides a proper voltage to the common source line 26 in response to the control signal. The memory cell array 10 may comprise one of a plurality of memory blocks.

Figure 2:
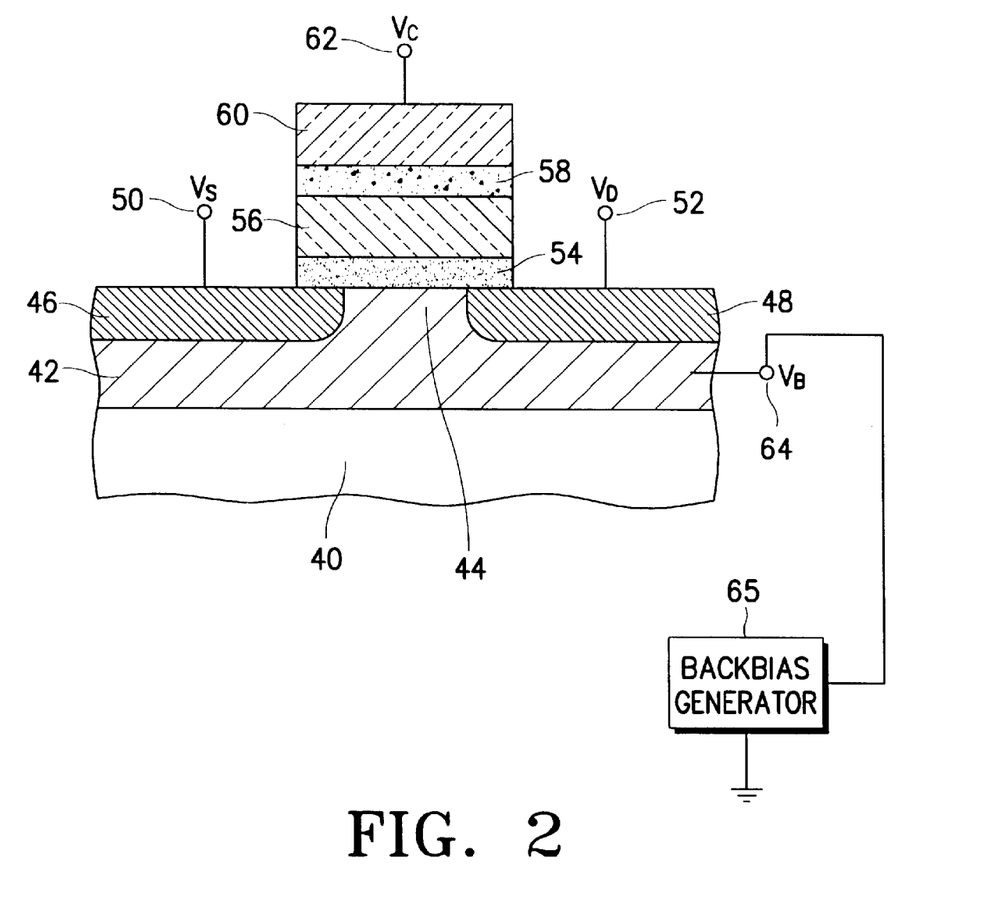
FIG. 2 is an enlarged cross-sectional view of one of the flash EEPROM cells of FIG. 1 in accordance with the present invention.

FIG. 2 is a cross-sectional diagram of a single memory cell of the memory cell array 10 as shown in FIG. 1. The memory cell is formed in a p-well region 42 on one surface of a semiconductor substrate 40. The p-well region 42 includes an electrode 64. The substrate 40 may comprise an n-well region. Formed in the p-well region 42 are a channel region 44 and source and drain regions 46, 48 at opposite sides of the channel region 44. The source region 46 is connected to a source electrode 50 which is in turn connected to the common source line 26 (see FIG. 1). The source electrode 50 may comprise an n-type buried layer in the p-well region 42 together with the source line 26. A drain electrode 52 is in contact with a corresponding one of bit lines BL1~BLm comprised of a conductive material. A floating gate 56 is formed on a tunnel oxide layer 54 over the channel region 44 and over edge portions of the source and drain regions 46, 48 contiguous to the channel region 44. A control gate 60 is formed over the floating gate 56 on an intermediate insulating layer 58. The tunnel oxide layer preferably has a thickness of about 100 Å. The floating gate 56 preferably comprises polycrystalline silicon (polysilicon).

The intermediate insulating layer 58 preferably comprises an ONO layer of $SiO_2/Si_3N_4/SiO_2$, at a thickness of about 200 Å. The control gate 60 may comprise polysilicon or refractory metal silicide on the polysilicon (typically referred to as polycide). The control electrode 62 is illustrated for the convenience of description. The control gate 60 is integral with a corresponding word line WLn.

When a memory cell, for example cell 12, is selected to be programmed, the bit line driving circuit 32 (see FIG. 1) provides 5 volts on a corresponding selected bit line BL1 and 0 volts on unselected bit lines BL2~BLm. The source line driving circuit 34 provides 0 volts on the common source line 26. A backbias generator (not shown) provides 0 volts at the p-well electrode 64. The word line driving circuit 30 outputs a voltage of about 10 volts on the corresponding selected word line WL1 for a time period of about 20 µsec, and 0 volts on the unselected word lines WL2~WLn. Following this, the selected memory cell 12 has a threshold voltage of about 7 volts by allowing electrons to be transported to its floating gate by channel hot electron injection, as described above. Any unselected memory cells, for example cells 16 and are not programmed by F-N tunnelling.

To instantaneously erase entire memory cell blocks, for example cells 12~23, in the memory cell array 10, the bit line driving circuit 32 floats bit lines BL1~BLm. The source line driving circuit 34 also floats the common source line 26, and the backbias generator applies 5 volts to the p-well electrode 64. The word line driving circuit 30 outputs a voltage of −10 volts to the word lines WL1~WLn for approximately 500 msec. This causes each of the memory cells 12~23 to emit electrons in each floating gate to the p-well, causing their threshold voltages to become 2 volts. Sequential erasure is possible by successively applying −10 volts to each selected word line, for example WL1, while applying a ground voltage to the unselected word lines, for example WL2~WLn. In this example, the memory cells 12, 16 and 20 coupled in a common row to word line WL1 are erased by F-N tunnelling.

Following an erase operation, a self-convergence operation of the threshold voltages of the erased memory cells is performed according to the present invention. The goal of self-convergence is to recover the erroneously negative threshold voltage of overerased memory cells, which is caused by a wide threshold voltage distribution of the memory cells following the erase operation, into a suitable positive threshold voltage.

According to the present embodiment, a self-convergence operation is performed by applying a first voltage, for example 3 volts, to the control gate electrode 62, applying a second voltage 2.5 volts to the drain electrode 52, grounding source electrode 50, and applying a negative backbias voltage, provided by backbias voltage generator 65 for example −3 volts to the p-well electrode 64. The voltage difference of 2.5 volts between the drain 48 and source 46 regions, the control gate voltage of 3 volts, and the grounded p-well electrode do not cause hot carriers to be generated in the channel region neighboring the drain region 46. The low voltage difference between the drain 48 and source 46 regions and that on the control gate 60 do not generate a strong inversion layer in the channel region. Thus, electrons from the source region 46 do not generate the impact ionization.

Channel hot electrons are generated by applying the voltage of −3 volts to the p-well electrode 64, which has an effect similar to applying 5 volts to the drain region 46 and 0 volts to the source region 48 and p-well region 42. The width of the depletion layer in the channel region 44 is increased by the application of the backbias voltage of −3 volts to the p-well electrode 64, thereby enhancing the generation of channel hot electrons. These channel hot electrons are trapped by the floating gate, thereby increasing the threshold voltage of the memory cell. If the threshold voltage reaches a steady-state, the variation of the threshold voltage from cell to cell decreases rapidly, and the threshold voltage is in a saturation region in which a variation slope is small. Once the threshold voltage reaches the saturation region, current flow from the drain region 48 to the source region 46 is suppressed, as is the generation of channel hot carriers. Thus, the cell current consumption is reduced. Since the generated hot holes are drawn out through the p-well electrode, the degradation of the tunnel oxide layer due to the hot holes may be prevented, thereby enhancing the life-time reliability of flash EEPROM. Thus, the self-convergence operation may be performed by adjusting the control gate voltage of the cell and the backbias voltage so as to gain a preferred value threshold voltage in the saturation region.

Returning to FIG. 1, to perform the self-convergence operation after erasing, the word line driving circuit 30 provides a voltage of 3 volts on word lines WL1~WLn, and the bit line driving circuit 32 outputs 2.5 volts on bit lines BL1~BLm. The source line driving circuit 34 outputs a ground voltage on the common source line 26. The backbias generator (not shown) outputs −3 volts to the p-well electrodes 64 (see FIG. 2) for 200 µsec. This causes the threshold voltages of overerased memory cells to shift to 2 volts. As described above, the self-convergence operation may be performed on all cells collectively coupled to word lines in a row. For example, if word line WL1 is selected, the self-convergence operation of memory cells 12, 16 and 20 on word line WL1 may be performed by applying 3 volts on the selected word line WL1, 0 volts on the unselected word lines WL2~WLn, 2.5 volts on the bit lines BL1~BLm, 0 volts on the common source line 26, and −3 volts to the p-well electrodes 64 (see FIG. 2).

Figure 3:
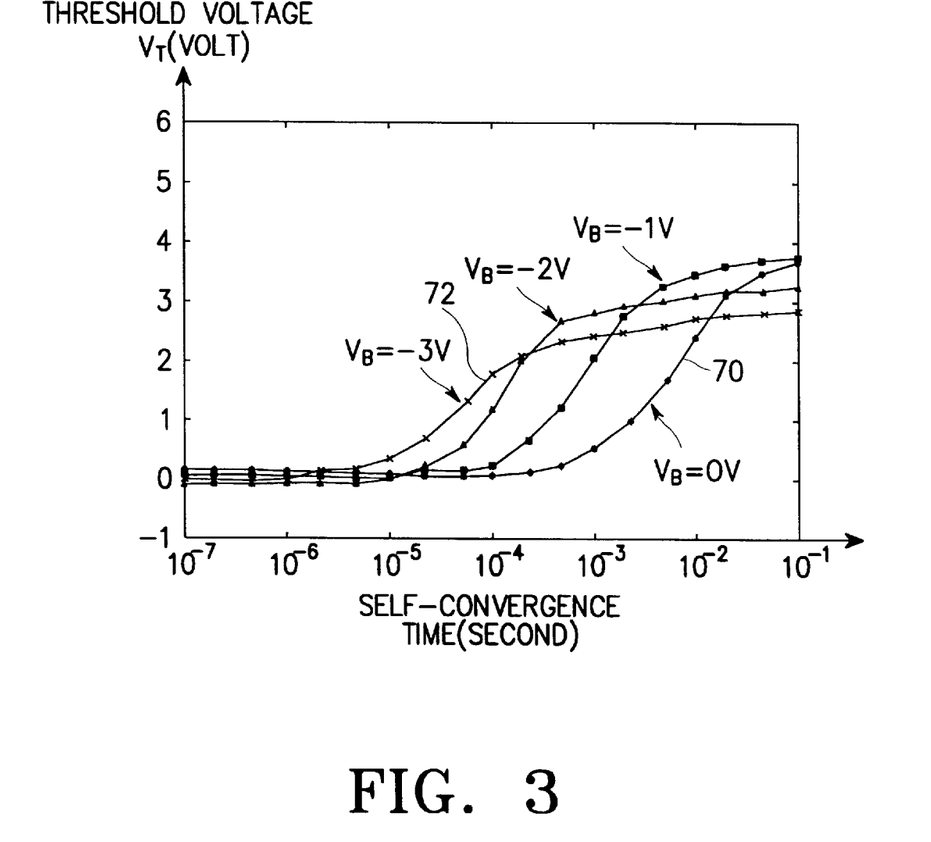
FIG. 3 is a graph illustrating threshold voltage variations of memory cells as a function of backbias voltage and self-convergence time.

FIG. 3 is a graph illustrating threshold voltage variations of a memory cell as a function of backbias voltage and self-convergence operation time. The self-convergence characteristic curves are illustrated for backbias voltages $V_B$ in the range of 0 to −3 volts, applied in the self-convergence condition under a control gate voltage $V_c$ of 3 volts, a drain region voltage $V_D$ of 2.5 volts and source region voltage of 0 volts. As shown in the graph, when $V_B=0$, and the targeted threshold voltage $V_T$ is 2 volts, the curve 70 does not exhibit saturation characteristics. However, when $V_B=-3$ volts and $V_T=2$ volts, it can be seen that the corresponding curve 72 is in the region of saturation. In this case, the time required by the self-convergence operation is approximately 200 µsec. after which the curve 72 is relatively flat and therefore is nearly saturated, therefore additional time for self-convergence will have little effect on the targeted threshold voltage $V_T$. It can be therefore seen that the self-convergence operating speed can be significantly enhanced by the adjustment of the backbias voltage $V_B$. As a result, predictable threshold voltage and self-convergence speed may be established in a stable range.

Figure 4:
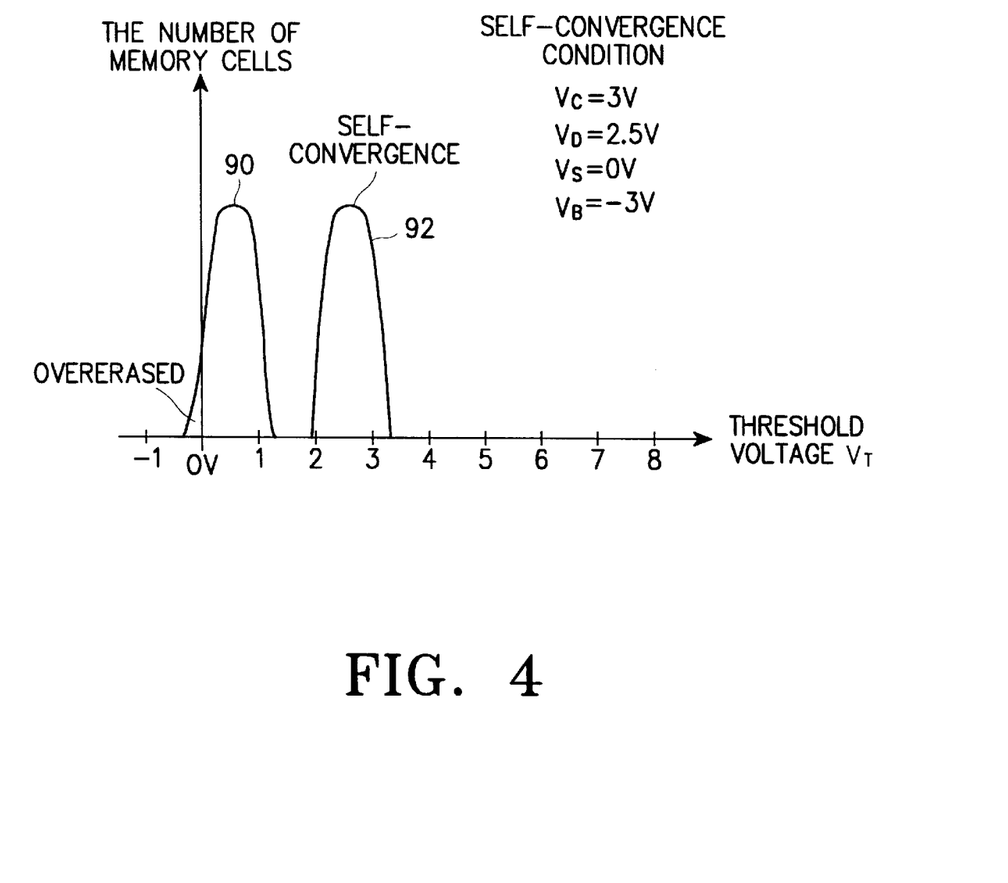
FIG. 4 is a diagram illustrative of a distribution of threshold voltages in memory cells.

FIG. 4 is a graph illustrative of a distribution of memory cells as a function of threshold voltage. It can be seen that overerased memory cells 90 self-converge to those with the threshold voltages of about 2 volts following the self-convergence operation 92. A wide distribution of threshold voltages for erased memory cells conform to a tight distribution thereof following the self-convergence operation.

Figure 5:
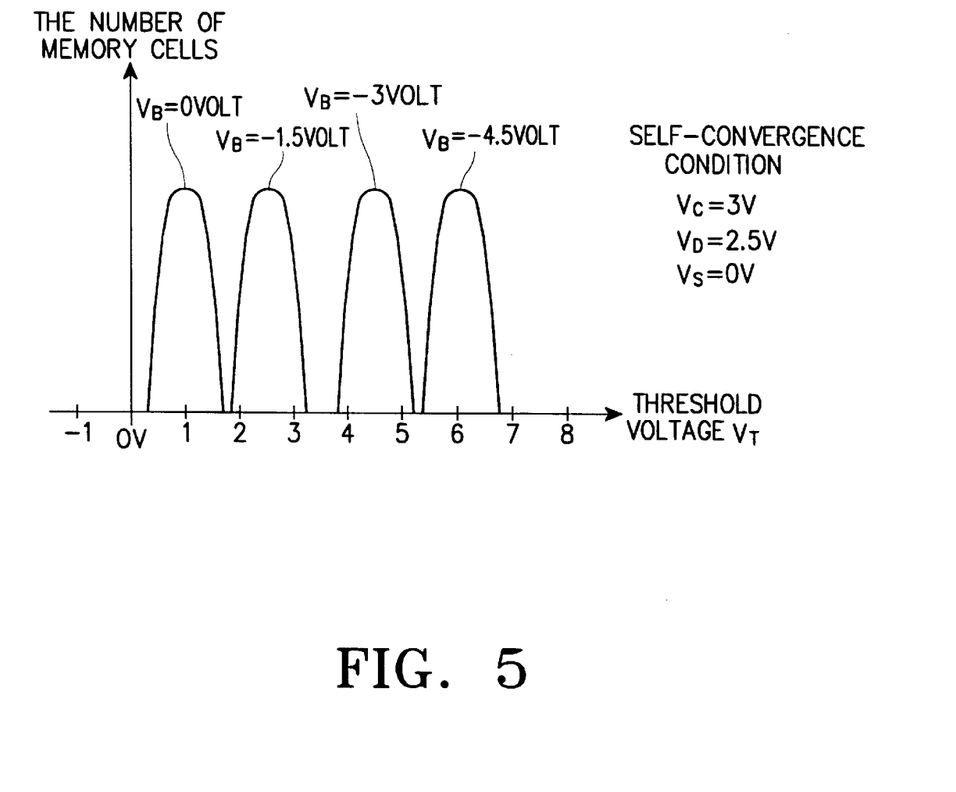
FIG. 5 is a diagram illustrative of threshold voltage distribution of a multibit memory cell when the self-convergence operation is employed in accordance with the present invention.

The present invention may be applied to multibit technology in which multiple data values are stored in a single memory cell. Since the threshold voltage levels of the memory cells may be controlled by as a function of applied backbias voltage, the self-convergence operation of multibit memory cells may provide precise distributions with the adjustment of backbias voltages $V_B$, for example of 0, −1.5, −3, and −4.5 volts, corresponding to multibit threshold voltages $V_T$ of 1, 2.5, 4.5 and 6 volts, respectively, as shown in FIG. 5.

Figure 6:
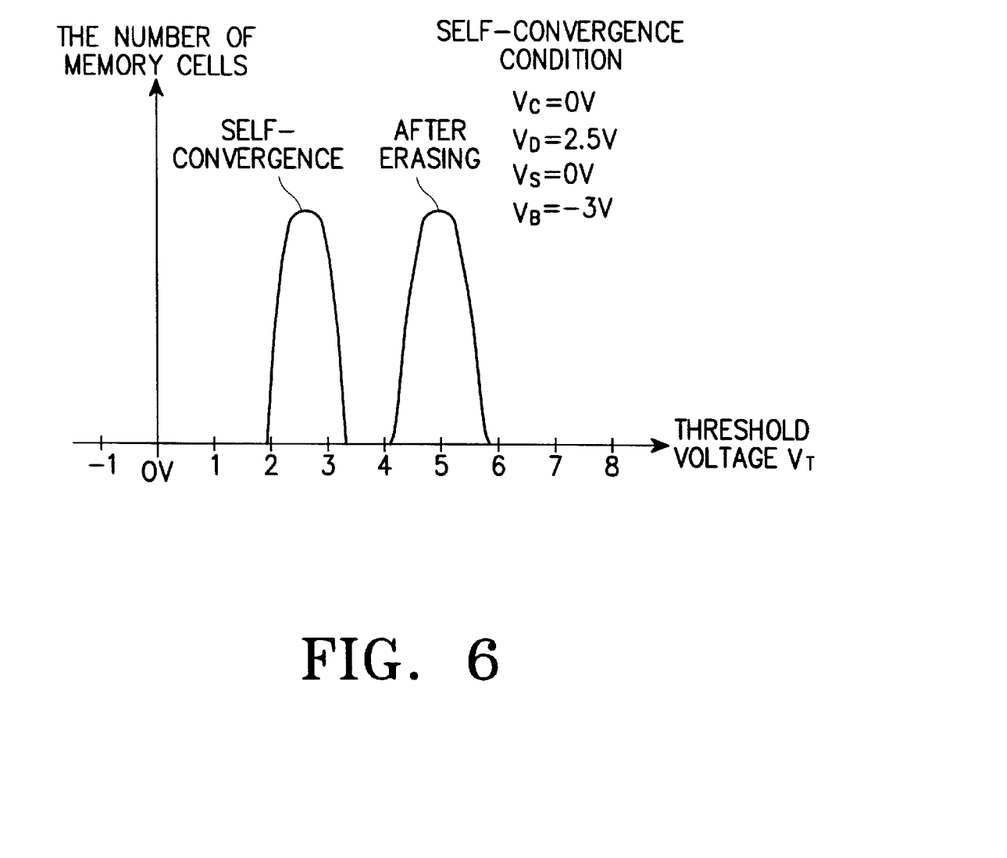
FIG. 6 is a diagram illustrative of a distribution of threshold voltages in memory cells following the operation of self-convergence, for overprogrammed memory cells, in accordance with the present invention.

The self-convergence operation of the present invention is further applicable to lowering a threshold voltage of an overprogrammed memory cell into a steady-state. As shown in FIG. 6, by setting the control gate voltage Vc to 0 volts, the drain region voltage $V_D$ to 2.5 volts, and the source region voltage Vs to 0 volts, an application of $V_B$=−3 volts during self-convergence operation causes the threshold voltage of the memory cell to be reduced to about 2 volts. In this case, since electrons over-accumulated in the floating gate are reduced by the movement of channel hot holes to the floating gate, the threshold voltage is decreased.

As described above, the self-convergence operation of the present invention causes the width of the depletion layer of the channel to be increased by the application of backbias voltage, thereby generating channel hot carriers. Since the self-convergence curve has a saturation state by the application of backbias voltage, establishment of the memory cell's threshold voltage in this saturation region causes the self-convergence operation to become stable, and the speed of self-convergence may be significantly increased by the adjustment of the backbias voltage. Current consumption of the memory cell is also be reduced. Degradation of the tunnel oxide layer of the memory cell is prevented, thereby enhancing the long life reliability thereof.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of converging threshold voltages of a plurality of memory cells to within a predetermined voltage range following erasure of said memory cells, each of said memory cells having source, channel and drain regions formed on a semiconductor substrate, a floating gate over said channel region and a control gate over said floating gate, said method comprising:

applying a first voltage to said control gates of said memory cells and applying a second voltage difference between said source and drain regions thereof; and applying a negative backbias voltage to said substrate so as to generate hot electrons/holes in said channel regions which are injected into said floating gates thereof following said erasure of said memory cell, causing the threshold voltages of said cells to be set within said range.

2. The method of claim 1, wherein said hot electrons/holes are not generated by the application of said second voltage difference between said source and drain regions thereof.

3. The method of claim 1, wherein said second voltage is a positive voltage such that said source region is grounded and said drain region is at said positive voltage.

4. The method of claim 1 further comprising determining the backbias voltage such that said self-convergence operation occurs within an acceptable time period, wherein said time period is a function of said backbias voltage.

5. The method of claim 4 further comprising applying a relatively stronger backbias voltage to decrease said self-convergence operation time period and a relatively weaker backbias voltage to increase said self convergence operation time period.

6. The method of claim 5 wherein application of a relatively stronger backbias voltage results in a saturation of threshold voltage at a relatively lower level, and wherein application of a relatively weaker backbias voltage results in a saturation of threshold voltage at a relatively higher level.

7. A method of converging threshold voltages of a plurality of memory cells to within a predetermined voltage range following erasure of said memory cells, each of said memory cells having source, channel and drain regions formed on a semiconductor substrate, a floating sate over said channel region and a control gate over said floating gate, said method comprising:

applying a first voltage to said control gates of said memory cells and applying a second voltage difference between said source and drain regions thereof; and applying a negative backbias voltage to said substrate so as to generate hot electrons/holes in said channel regions which are injected into said floating gates thereof following said erasure of said memory cell, causing the threshold voltages of said cells to be set within said range; and wherein each of said memory cells is a multibit memory cell and wherein said backbias voltage is selectable for generating a corresponding selectable threshold voltage in said cell determined by said multibit voltage values.

* * * * *